(12) United States Patent
Berggren et al.

(10) Patent No.: US 8,625,075 B2
(45) Date of Patent: Jan. 7, 2014

(54) SYSTEM AND METHODS RELATED TO GENERATING ELECTROMAGNETIC RADIATION INTERFERENCE PATTERNS

(75) Inventors: Karl K. Berggren, Arlington, MA (US); Hasan Korre, Cambridge, MA (US); Corey P. Fucetola, Fort Collins, CO (US)

(73) Assignee: Massachusetts Institute of Technology, Cambridge, MA (US)

( * ) Notice: Subject to any disclaimer, the term of this patent is extended or adjusted under 35 U.S.C. 154(b) by 380 days.

(21) Appl. No.: 12/959,128

(22) Filed: Dec. 2, 2010

(65) Prior Publication Data

US 2012/0099090 A1  Apr. 26, 2012

Related U.S. Application Data

(60) Provisional application No. 61/405,969, filed on Oct. 22, 2010.

(51) Int. Cl.
*G03B 27/32* (2006.01)
*G03B 27/42* (2006.01)
*G03B 27/54* (2006.01)

(52) U.S. Cl.
USPC ............................ 355/67; 355/53; 355/77

(58) Field of Classification Search
CPC .................... G03F 7/70325; G03F 7/70408
USPC ..................... 355/53, 67, 71, 77; 356/450
See application file for complete search history.

(56) References Cited

U.S. PATENT DOCUMENTS

| 6,304,318 | B1 * | 10/2001 | Matsumoto | 355/55 |
|---|---|---|---|---|
| 7,304,775 | B2 | 12/2007 | Hobbs et al. | |
| 2005/0094914 | A1 * | 5/2005 | Gines et al. | 385/1 |
| 2005/0248758 | A1 * | 11/2005 | Carron et al. | 356/301 |
| 2006/0110694 | A1 * | 5/2006 | Lin | 430/396 |
| 2008/0175348 | A1 * | 7/2008 | Marconi et al. | 378/34 |
| 2011/0019175 | A1 * | 1/2011 | Fu | 355/74 |

FOREIGN PATENT DOCUMENTS

WO   WO 2012/054837 A1   4/2012

OTHER PUBLICATIONS

Moser et al, "Compact self-aligned external cavity lasers using volume gratings," Proc. of SPIE vol. 7194 71940F-1.*
International Search Report and Written Opinion for PCT/US2011/057293 mailed Apr. 3, 2012.
International Preliminary Report on Patentabilty for PCT/US2011/057293 mailed May 2, 2013.
Carter et al., "Interference Lithography," MTL Annual Report 2003:186-88.
Fucetola et al., "Low-cost interference lithography." *J. Vac. Sci. Technol.* Dec. 3, 2009, B27(6): 2958-61.
Fucetola et al., "Low-cost Lloyd's mirror interference lithography." Chapter 25. RLE Progress Report 151. 43-4. Believed to have been made available to the public on Jun. 7, 2010.

(Continued)

*Primary Examiner* — Toan Ton
*Assistant Examiner* — Colin Kreutzer
(74) *Attorney, Agent, or Firm* — Wolf, Greenfield & Sacks, P.C.

(57) ABSTRACT

Systems and methods related to the generation of interference patterns using electromagnetic radiation are generally described. Some embodiments are directed to the use of such systems and methods to perform interference lithography.

20 Claims, 11 Drawing Sheets

(56) References Cited

OTHER PUBLICATIONS

Korre et al., "Development of a simple, compact, low-cost interference lithography system." *J Vac Sci Technol.* Dec. 2, 2010;B28(6):C6Q20-4.

Korre et al., "Investigation of laser diodes as low-cost sources for interference lithography." Poster presented with no handouts at the 54th International Conference on Electron, Ion, Photon Beam Technology and Nanofabrication, Jun. 2, 2010.

Korre et al., "Low-cost Interference Lithography." Powerpoint presentation (23 slides) presented orally with no handouts at the 53rd International Conference on Electron, Ion, Photon Beam Technology and Nanofabrication, May 29, 2009.

Korre et al., "Low-cost Lloyd's Mirror for interference lithography," Poster presented with no handouts at the MIT Summer Research Program, Aug. 6, 2008.

Korre et al., "The tiny Lloyd's mirror: A low-cost interference lithography system." MTL Annual Research Report 2010. 3 pages.

Korre, "On the development of a low-cost lithographic interferometer." Master's Thesis, MIT. Catalogued on Dec. 2, 2010.

Korre, et al., "Low-cost Lloyd's mirror interference lithography." RLE Progress Report 152, Chapter 35. (2010). pp. 35-30 to 35-31.

Walsh, "On the design of lithographic interferometers and their application." Ph.D. Thesis, MIT. Catalogued Oct. 28, 2004.

Wieman et al., "Using diode lasers for atomic physics," *Rev. Sci. Instrum.* Jan. 1991; 62(1): 1-20.

\* cited by examiner

SYSTEM AND METHODS RELATED TO GENERATING ELECTROMAGNETIC RADIATION INTERFERENCE PATTERNS

RELATED APPLICATIONS

This application claims the benefit of U.S. Provisional Patent Application Ser. No. 61/405,969, filed Oct. 22, 2010, and entitled "Interference Lithography System and Method," which is incorporated herein by reference in its entirety for all purposes.

FIELD OF INVENTION

Systems and methods related to the generation of interference patterns using electromagnetic radiation are generally described. Some embodiments are directed to the use of such systems and methods to perform interference lithography.

BACKGROUND

Interference lithography is a technique that can be used to make periodic nanostructures using the interference of two coherent light beams. One particular type of tool that can be used in such applications is based on the Lloyd's mirror configuration. In such tools, a laser is directed toward a substrate on which one wishes to produce a pattern of light. A first portion of the laser light is incident directly on the substrate while a second portion is reflected by a mirror before reaching the substrate. The first and second portions then interfere with each other to create a series of high intensity and low intensity light bands. Such tools could be useful in producing periodic nanostructures such as, for example, photonic crystals, diffraction gratings, magnetic domains in recording media, and micro- and nanofluidic channels, among others. However, such systems generally require time-consuming and complicated alignment. In addition, such tools can be relatively large in size and expensive. These limitations, among others, have prevented their ubiquitous use.

SUMMARY OF THE INVENTION

The generation of interference patterns using electromagnetic radiation, and associated systems and methods, are generally described. The inventive systems and methods can be useful in interference lithography. The subject matter of the present invention involves, in some cases, interrelated products, alternative solutions to a particular problem, and/or a plurality of different uses of one or more systems and/or articles.

In one aspect, systems for generating an interference pattern of electromagnetic radiation are described. In one set of embodiments, the system comprises a source of electromagnetic radiation comprising a laser and a diffraction grating constructed and arranged to provide optical feedback to the laser; and a spatial filter constructed and arranged to receive at least a portion of the electromagnetic radiation from the source, to transmit at least a first portion of the received electromagnetic radiation to a reflective surface, and to transmit a second portion of the received electromagnetic radiation to a pattern substrate.

The system can comprise, in some embodiments, a source of electromagnetic radiation; and a spatial filter comprising a focusing element and a transmission element, wherein the focusing element and the transmission element are not substantially spatially adjustable relative to each other along a focal axis of the focusing element; and the spatial filter is constructed and arranged to receive at least a portion of the electromagnetic radiation from the source, to transmit at least a first portion of the received electromagnetic radiation to a reflective surface, and to transmit a second portion of the received electromagnetic radiation to a pattern substrate.

In some embodiments, the system comprises a source of electromagnetic radiation; a spatial filter; a reflective surface; and a pattern substrate; wherein the spatial filter is constructed and arranged to receive at least a portion of the electromagnetic radiation from the source, to transmit at least a first portion of the received electromagnetic radiation to the reflective surface, and to transmit a second portion of the received electromagnetic radiation to the pattern substrate, and the reflective surface and the pattern substrate are not substantially spatially adjustable relative to each other.

The system can comprise, in some embodiments, a source of electromagnetic radiation, comprising a housing, a laser diode fixedly secured to the housing, and a diffraction grating fixedly secured to the housing and constructed and arranged to provide optical feedback to the laser diode; a spatial filter comprising a focusing element and a transmission element; a reflective surface; and a pattern substrate; wherein the focusing element and the transmission element are constructed and arranged such that they are not substantially spatially adjustable relative to each other along a focal axis of the focusing element, and the spatial filter is constructed and arranged to receive at least a portion of the electromagnetic radiation from the source, transmit at least a first portion of the received electromagnetic radiation to the reflective surface, and transmit a second portion of the received electromagnetic radiation to the pattern substrate.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Systems and methods related to the generation of interference patterns using electromagnetic radiation are generally described. Some embodiments are directed to the use of such systems and methods to perform interference lithography.

In one aspect, an inventive system for generating an interference pattern of electromagnetic radiation is provided. In some embodiments, the system can include a source of electromagnetic radiation, a spatial filter, a reflective surface, and/or a substrate on which one wishes to produce a pattern of electromagnetic radiation. In some embodiments, one or more pairs of components in the system can be constructed and arranged such that they are spatially fixed relative to each other, and relatively little alignment is necessary. For example, in some embodiments, the source of electromagnetic radiation includes a laser and a diffraction grating that can be, for example, integrated with the laser within a single unit. As another example, the spatial filter can include a focusing element (e.g., a lens) and a transmission element (e.g., a pinhole aperture) arranged such that they are not substantially adjustable relative to each other along the focal axis of the focusing element. As yet another example, the receiving substrate and the reflective surface can be substantially fixed relative to each other in some embodiments. By fixing two or more components of the system relative to each other along at least one direction, the need for time-consuming and complicated alignment steps can be reduced or eliminated, lowering the cost and complexity of the overall system.

The inventive systems and methods can provide several advantages. For example, relatively inexpensive components can be used to assemble some of the inventive systems. Furthermore, as mentioned, many of the systems and methods described herein do not require complicated and time-consuming alignment procedures to produce useful results. The inventive systems can also occupy a relatively small footprint and/or volume of space. In some embodiments, despite the relatively small footprint, the system can be used to produce patterns over relatively large areas. Also, the inventive systems and methods are relatively insensitive to environmental conditions (e.g., vibrations) that can adversely affect many prior art systems. Other advantages associated with the inventive systems and methods are discussed in more detail elsewhere herein.

Figure 1:
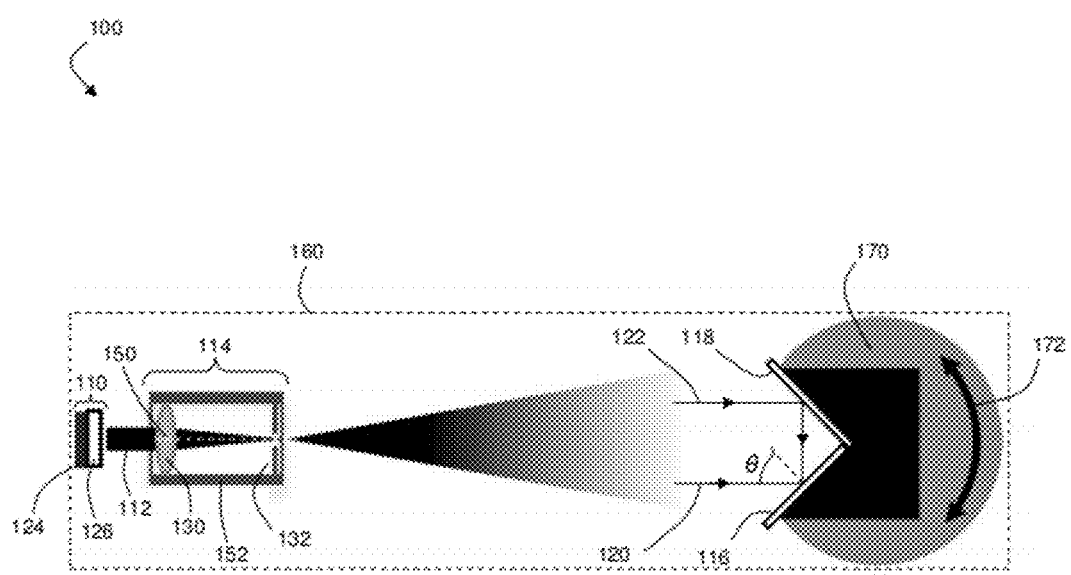
FIG. 1 includes a top-view, cross-sectional schematic illustration, according to one set of embodiments, of a system for generating an interference pattern of electromagnetic radiation.

FIG. 1 includes a top-view, cross-sectional schematic illustration of an exemplary system 100 for generating an interference pattern of electromagnetic radiation on a substrate. In the set of embodiments illustrated in FIG. 1, system 100 includes a source 110 of electromagnetic radiation 112, a spatial filter 114, a reflective surface 118, and a substrate 116 (i.e., a pattern substrate) on which an interference pattern of electromagnetic radiation can be formed.

Briefly, in the set of embodiments illustrated in FIG. 1, electromagnetic radiation from source 110 is transmitted to spatial filter 114, where the electromagnetic radiation can be spatially "cleaned up" such that a relatively smooth intensity pattern is formed by the electromagnetic radiation exiting the spatial filter when it is incident upon a surface (e.g., a substrate such as pattern substrate 116). After passing through the spatial filter, a first portion 120 of the electromagnetic radiation can be transmitted to the pattern substrate 116. As used herein, a "pattern substrate" refers to any substrate on which an interference pattern of electromagnetic radiation can be formed. In addition, a second portion 122 of the electromagnetic radiation can be transmitted to the reflective surface 118. At least some of the electromagnetic radiation within portion 122 can be reflected by surface 118 such that it is incident upon pattern substrate 116, where it constructively and destructively interferes with portion 120 to form an interference pattern. The interference pattern can include, for example, a series of repeating high intensity lines divided by a series of repeating low-intensity lines, which can be used, for example, to produce corresponding patterns in photoresist as shown, for example, in FIGS. 3A-3C. The period of the resulting lines can vary with the angle of incidence of the electromagnetic radiation upon the substrate surface, relative to the normal of the substrate surface (illustrated as θ in FIG. 1) according to the following relationship:

$$p = \frac{\lambda}{2\sin\theta} \quad [1]$$

In some embodiments, the source of electromagnetic radiation can comprise a laser and a diffraction grating. For example, in the set of embodiments illustrated in FIG. 1, source 110 includes laser 124 and diffraction grating 126. In some embodiments, the diffraction grating can be constructed and arranged to provide optical feedback to the laser. As used herein, a component is "constructed and arranged to provide optical feedback" to a unit when it is constructed to redirect at least one wavelength of electromagnetic radiation originating from the unit (e.g., a laser) back to that unit, which can result in a higher intensity of emission of the redirected wavelength(s). Optical feedback can involve the redirection of a single wavelength, multiple wavelengths, a single band of wavelengths, or multiple bands of wavelengths. In some embodiments, optical feedback can result in the suppression of other wavelengths other than the redirected wavelengths.

In some embodiments, the diffraction grating can be constructed and arranged, to provide optical feedback to the laser by redirecting wavelengths of electromagnetic radiation that lie within a relatively narrow band of wavelengths (e.g., less than or equal to about 20 nm wide, less than or equal to about 10 nm wide, less than or equal to about 5 nm wide, less than or equal to about 2 nm wide, or less than or equal to about 1 nm wide). By redirecting wavelengths of electromagnetic radiation back into the laser, the temporal coherence of the laser can be improved. Such an arrangement can allow one to produce a relatively highly monochromatic beam of light, even when broadband laser sources such as laser diodes are used as laser 124 within source 110.

In some embodiments, the laser and the diffraction grating can be spatially fixed relative to each other. Fixing the laser and the diffraction grating relative to each other can simplify the alignment process, allowing for relatively simple assembly and operation of the system. In some embodiments, the diffraction grating and/or the laser can be fixed relative to the other at at least one point. For example, one of the laser and the diffraction grating can be affixed to a housing such that it is stationary, and the other of the laser and the diffraction grating can be affixed to the housing such that it can be rotated (i.e., tilted) around an axis, but is otherwise fixed along the axis. In some embodiments, the laser and the diffraction grating are not substantially spatially adjustable relative to each other in any direction. For example, the laser and the diffraction grating can both be fixedly secured to a housing such that they are substantially immobile (i.e., they cannot be substantially tilted or otherwise substantially moved relative to each other along any direction). One of ordinary skill in the art would recognize that two elements that are substantially fixed relative to each other might be able to be moved along very small lengths (e.g., a few micrometers or less) that do not affect the performance of the system, but otherwise are not movable relative to each other without disassembling the unit onto which they have been fixed. In some embodiments, the laser and the diffraction grating can be spatially fixed such that they are completely immobile (even over very small lengths) relative to each other.

The laser and the diffraction grating can be acquired as a single integral unit, in some embodiments. In other embodiments, the laser and the diffraction grating can be acquired as discrete units and assembled such that they are spatially fixed relative to each other. When the laser and the diffraction grating are integrated with a housing, the housing can be enclosed, in some embodiments. The use of an enclosed housing can be advantageous as it can reduce unwanted escape of light from the source. It should be understood, however, that the use of an enclosed housing is not required, and other embodiments can involve the use of a source comprising a laser and a diffraction grating in a housing that is open to the outside environment.

A variety of types of lasers can be used in the source of electromagnetic radiation. Exemplary lasers suitable for use in the embodiments described herein include, but are not limited to, gas lasers (e.g., chemical lasers, excimer lasers, and the like), solid state lasers, fiber lasers, photonic crystal lasers, dye lasers, free electron lasers, and diode lasers. In some embodiments, diode lasers can be particularly useful due to their low cost and relatively easy integration with the systems described herein. In some embodiments, a blue laser diode (e.g., wherein a majority or all of the electromagnetic radiation emitted by the diode has a wavelength of between about 360 nm and about 480 nm, between about 380 nm and about 450 nm, between about 400 nm and about 425 nm, or between about 400 nm and about 410 nm) can be used.

While lasers have been primarily described, it should be understood that other components capable of generating electromagnetic radiation sufficiently coherent to produce the desired interference patterns of electromagnetic radiation could also be used, in addition to or in place of a laser.

Referring back to FIG. 1, the spatial filter 114 can be constructed and arranged to receive at least a portion of the electromagnetic radiation from the source (e.g., radiation 112), to transmit a first portion (e.g., portion 122) of the received electromagnetic radiation to a reflective surface, and to transmit a second portion (e.g., portion 120) of the received electromagnetic radiation to a pattern substrate. As is familiar to those of ordinary skill in the art, the spatial filter can be used to remove aberrations in the beam of electromagnetic radiation which may occur, for example, due to imperfect, dirty, or damaged optics and/or due to variations in the laser gain medium.

In some embodiments, the spatial filter can comprise a focusing element and a transmission element. For example, in the set of embodiments illustrated in FIG. 1, spatial filter 114 includes focusing element 130 and transmission element 132. The focusing element can comprise any suitable article capable of focusing incoming electromagnetic radiation onto a relatively small area, such that the intensity of the electromagnetic radiation exiting the focusing element is greater than the intensity of the electromagnetic radiation entering the focusing element. For example, in FIG. 1, focusing element 130 comprises a focusing lens. Examples of focusing lenses that can be used include, but are not limited to, biconvex lenses (e.g., equiconvex lenses, non-equiconvex lenses), plano-convex lenses, or any other suitable converging lens. In other embodiments, the focusing element can comprise, for example, a zone plate, a dielectric lens, or a transmission grating.

The transmission element can comprise any suitable article capable of allowing one portion of electromagnetic radiation to be transmitted while blocking the transmission of another, spatially separate portion of electromagnetic radiation. For example, in the set of embodiments illustrated in FIG. 1, transmission element 132 comprises an aperture (which allows the transmission of electromagnetic radiation) formed in a material that reflects and/or absorbs at least one wavelength (e.g., substantially all wavelengths) of electromagnetic radiation from the source. One example of such an element is a pinhole aperture. In embodiments in which a pinhole aperture is employed, the pinhole can be in any suitable shape (e.g., a circle, an ellipse, a square, a rectangle or any other suitable shape). In other embodiments, the transmission element can comprise, for example, an element that changes the polarization of all the focal spots except the on-axis beam.

It has been discovered that nearly perfect alignment between the focusing element and the transmission element is not required to obtain acceptable results using the systems and methods described herein. For example, in many instances, one can obtain highly acceptable results (e.g., well defined interference patterns on the pattern substrate) even when the transmission element is aligned such that it does not fall within the focal plane of the focusing element. Accordingly, in some embodiments, the focusing element and the transmission element can be spatially fixed relative to each other in at least one direction. Fixing the focusing element and the transmission element relative to each other can simplify the alignment process, allowing for relatively simple assembly and operation of the system. In some embodiments, the focusing element and the transmission element are not substantially spatially adjustable relative to each other along the focal axis of the focusing element. One of ordinary skill in the art would be able to identify the focal axis for a given focusing element, which generally extends from the focal point on one side of the focusing element to the focal point on the opposite side of the focusing element. For example, in the set of embodiments illustrated in FIG. 1, the focal axis of lens 130 is illustrated as dotted line 150. In FIG. 1, lens 130 and transmission element 132 are not substantially spatially adjustable relative to each other along focal axis 130.

In some embodiments, the focusing element and the transmission element are not substantially spatially adjustable relative to each other in any direction. For example, the focusing element and the transmission element can both be fixedly secured to a housing such that they are substantially immobile (i.e., they cannot be substantially tilted or otherwise substantially moved relative to each other along any direction). In the set of embodiments illustrated in FIG. 1, lens 130 and transmission element 132 are fixedly secured to housing 152 as part of a lens tube system. As noted elsewhere herein, one of ordinary skill in the art would recognize that two elements that are substantially fixed relative to each other might be able to be moved along very small lengths (e.g., a few micrometers or less) that do not affect the performance of the system, but otherwise are not movable relative to each other without disassembling the unit onto which they have been fixed. In some embodiments, the focusing element and the transmission element can be spatially fixed such that they are completely immobile (even over very small lengths) relative to each other.

The focusing element and the transmission element can be acquired as a single integral unit, in some embodiments. In other embodiments, the focusing element and the transmission element can be acquired as separate units and assembled such that they are spatially fixed relative to each other. When the focusing element and the transmission element are integrated with a housing, the housing can be enclosed, in some embodiments. The use of an enclosed housing can be advantageous as it can reduce unwanted escape of light from the spatial filter. It should be understood, however, that the use of an enclosed housing is not required, and other embodiments can involve the use of an unenclosed spatial filter comprising a focusing element and a transmission element.

Referring back to FIG. 1, system 100 can further include a pattern substrate 116 and a reflective surface 118. The pattern substrate 116 can be constructed and arranged to receive a first portion (e.g., portion 120) of electromagnetic radiation from spatial filter 114. In addition, the reflective surface 118 can be constructed and arranged to receive a second portion (e.g., portion 122) of electromagnetic radiation from spatial filter, and to reflect at least some of the second portion toward pattern substrate 116. The reflected portion from reflected surface 118 can interfere with first portion 120 to form an interference pattern on pattern substrate 116.

A variety of suitable articles can be used to provide the reflective surface. For example, in some embodiments, a metal mirror, a dielectric mirror, and/or other article comprising at least one reflective surface can be used. In some embodiments, the reflective surface can be part of a first surface mirror (e.g., comprising one or more layers of metal and/or other dielectric material) which can confine the reflection to the first surface of the mirror.

A variety of articles can also be used as a pattern substrate. For example, a semiconductor wafer (e.g., a silicon wafer), a metal sheet, a relatively dark piece of paper, or any other suitable substrate on which an interference pattern can be displayed can be used as a pattern substrate. In some embodiments, the pattern substrate can comprise at least one layer of photoresist, which, after exposure to the interference pattern, can be developed to produce a repeating pattern of structures (e.g., channels such as micro- or nanofluidic channels) within the photoresist layer(s). In some embodiments, the pattern substrate can include a surface constructed and arranged to display the interference pattern, which might be useful, for example, in a kit used to illustrate electromagnetic radiation interference in a classroom demonstration.

In some embodiments, the reflective surface and the pattern substrate are not substantially spatially adjustable relative to each other. By fixing the reflective surface and the pattern substrate relative to each other, the angle between the reflective surface and the pattern substrate can be fixed. In some such embodiments, disruptions to the system (e.g., via vibrations, jarring, knocking, or other disruptions) do not substantially alter the angle between the reflective surface and the substrate, and therefore, do not disrupt the interference pattern formed on the pattern substrate.

The positions of the reflective surface and the pattern substrate can be fixed in a variety of ways. In some instances, the reflective surface and/or the pattern substrate can be attached to a mount (e.g., a machinist's block fabricated from a unitary material, such as mount 170 illustrated in FIG. 1). The reflective surface and/or the pattern substrate can be attached to the mount using, for example, tape, screws, or any other suitable attachment scheme.

In some embodiments, the reflective surface and/or the pattern substrate can be part of a unitary material. For example, the reflective surface and/or the pattern substrate can comprise a polished surface of the unitary material. In one specific example, a machinist's block can be machined such that two surfaces are cut into the block, one surface finished (e.g., polished) to form the reflective surface, and the other surface finished (e.g., by drilling threaded receiving holes to fit screws) to support a pattern substrate. In some cases, one of the surfaces can be finished (e.g., polished) to form the reflective surface and the other can be finished (e.g., polished) to form the pattern substrate.

In some embodiments, the reflective surface and the pattern substrate can be constructed and arranged such that they can be rotated in concert with each other. For example, in some embodiments, the mount on which the reflective surface and the pattern substrate are arranged (e.g., mount 170 in FIG. 1) can be rotated (e.g., along arrow 172 in FIG. 1). When the reflective surface and the pattern substrate are rotated (e.g., by rotating the mount), the angle of incidence of the electromagnetic radiation from the spatial filter upon the reflective surface and/or pattern substrate (e.g., θ in FIG. 1) is altered. As described elsewhere herein (e.g., Equation 1 and related description), altering the angle of incidence of the electromagnetic radiation can affect the period of the pattern of electromagnetic radiation on the pattern substrate. In some embodiments, the use of a rotatable mount increases the ease with which the angle of incidence can be changed, reducing or eliminating the need for a complicated alignment step.

The reflective surface and the pattern substrate can be fixed relative to each other at any suitable angle. In some embodiments, the reflective surface and the pattern substrate can be arranged such that they form an angle of between about 45° and about 135°, between about 60° and about 120°, between about 75° and about 105°, or between about 85° and about 95°.

The systems described herein can be relatively small, in some embodiments. For example, in some embodiments, the source, spatial filter, pattern substrate, reflective surface, and any mount on which the reflective surface and the pattern substrate are fixed can be arranged such that they occupy a footprint of less than about 2 m$^2$, less than about 1 m$^2$, less than about 0.5 m$^2$, or less than about 0.25 m$^2$ during operation. As used herein, the footprint of the system is measured as the area occupied by a rectangle with a length measured from the back of the mount to which the reflective surface and pattern substrate are mounted to the back of the source of electromagnetic radiation, and a width measured as the widest dimension across the components of the system and perpendicular to the length. For example, in the set of embodiments illustrated in FIG. 1, system 100 includes a footprint outlined by dotted rectangle 160.

In some embodiments, the shortest distance between the geometric center of the transmission element and the geometric center of the pattern substrate can be less than about 1 m, less than about 500 cm, less than about 100 cm, less than about 50 cm, or less than about 35 cm.

The terms "interference pattern" and "interference pattern of electromagnetic radiation" are used to refer to patterns formed when portions of electromagnetic radiation interfere to produce regions of relatively high amplitude and regions of relatively low amplitude, with the high and low amplitude regions arranged to form a pattern. While patterns of repeating, substantially straight lines are primarily described, it should be understood that interference patterns are not so limited.

While the embodiments described herein generally describe interference patterns formed by visible light, it should be understood that, in some embodiments, electromagnetic radiation with wavelengths falling outside the visible spectrum (e.g., ultraviolet electromagnetic radiation, infrared electromagnetic radiation, microwave electromagnetic radiation, and the like) could be used.

Figure 3A:
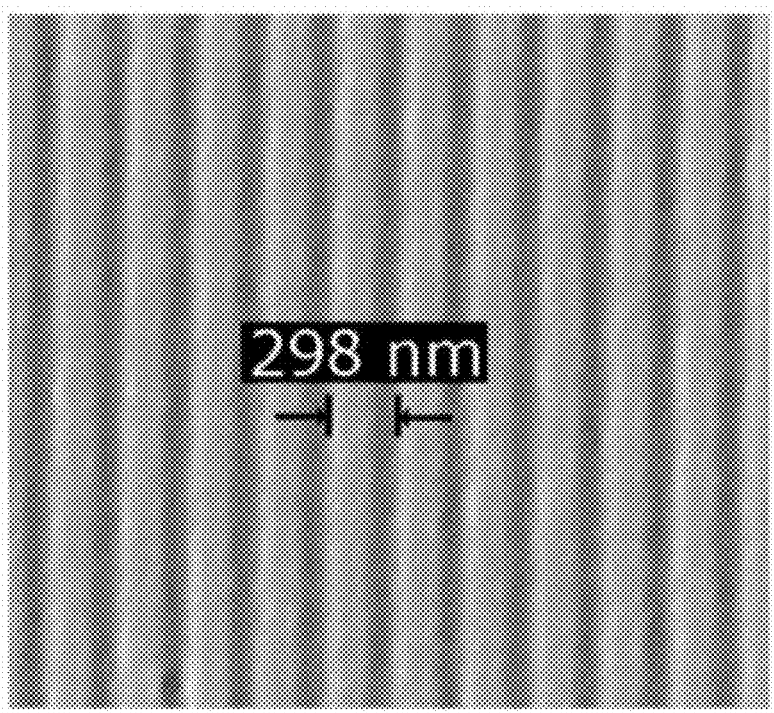
FIGS. 3A-3D include, according to one set of embodiments, exemplary scanning electron microscope images of patterned regions.
Figure 3B:
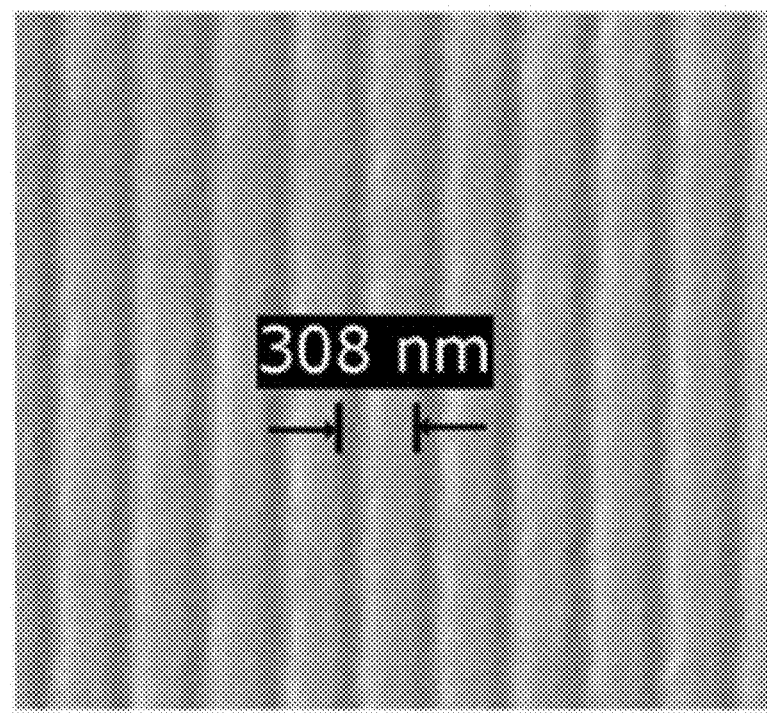
Figure 3C:
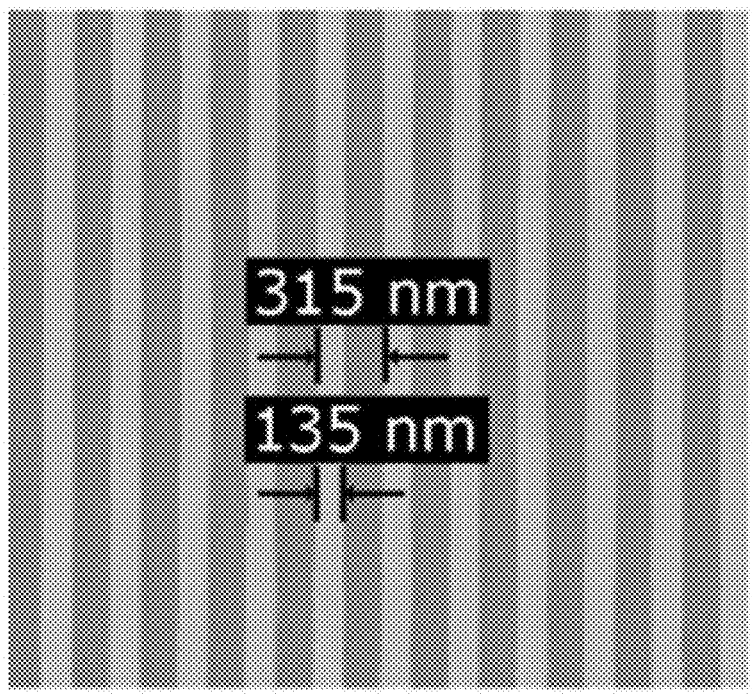
Figure 3D:
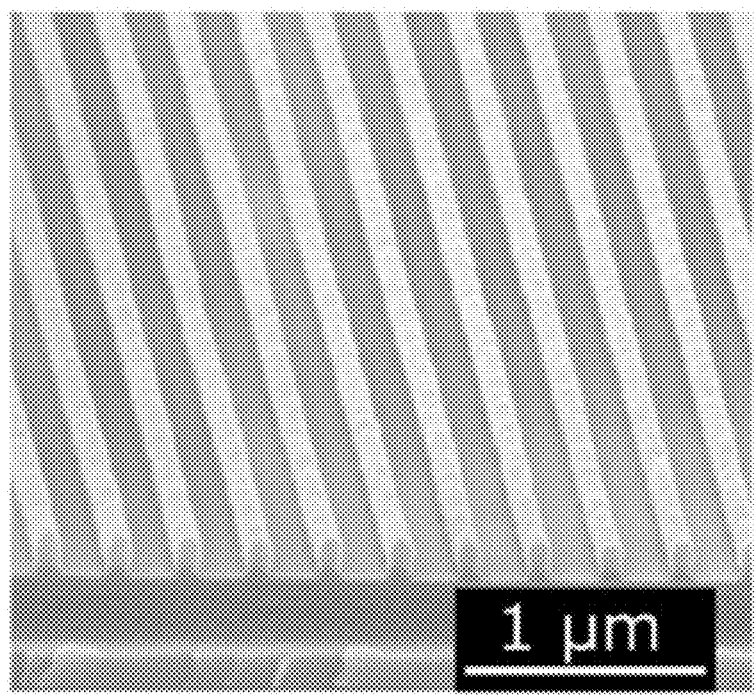

The systems described herein can have a variety of uses. In some embodiments, the system can be used to perform interference photolithography. As described elsewhere, the pattern substrate can comprise at least one layer of photoresist. The photoresist can be exposed to the interference pattern, and subsequently developed to produce a repeating pattern of photoresist. 1-dimensional and/or 2-dimension repeating patterns can be formed in the photoresist using the systems and methods described herein. FIGS. 3A-3C include images of exemplary 1-dimensional patterns that can be formed using the systems and methods described herein. FIG. 7D includes an image of an exemplary 2-dimensional pattern that can be formed using the systems and methods described herein. In some embodiments, the system can be used to produce a repeating pattern that defines an area of at least about 0.1 mm$^2$, at least about 1 mm$^2$, or at least about 5 mm$^2$.

One of ordinary skill in the art would understand that a 1-dimensional pattern might include some imperfections or other variations over the other two dimensions (and 2-dimensional patterns might include some imperfections or other variations over the third dimension), but still be classified as 1-dimensional (or 2-dimensional).

The systems described herein can also be used, for example, as a teaching tool to demonstrate electromagnetic radiation interference in a classroom setting.

In some embodiments, the components described herein can be included as part of kit (e.g., for use as a demonstration kit, for use as a benchtop lithography system, etc.). The kit can include, in some embodiments, pre-assembled components, which can reduce the amount of time needed to align various system components. For example, in some cases, the kit can include a laser and diffraction grating pre-assembled such that they are at least partially fixed relative to each other. In some embodiments, the kit can include a focusing element and a transmission element pre-assembled such that they are at least partially fixed relative to each other. In some cases, the kit can include a reflective surface and a pattern substrate pre-assembled such that they are at least partially fixed relative to each other. The kit can include, in some embodiments, instructions for assembling and/or using the system to generate an interference pattern of electromagnetic radiation.

The following documents are incorporated herein by reference in their entirety for all purposes: U.S. Provisional Patent Application Ser. No. 61/405,969, filed Oct. 22, 2010, and entitled "Interference Lithography System and Method." All other patents, patent applications, and documents mentioned herein are also hereby incorporated by reference in their entirety for all purposes.

The following examples are intended to illustrate certain embodiments of the present invention, but do not exemplify the full scope of the invention.

EXAMPLE 1

This example demonstrates a simple system comprising a 405 nm diode laser and optical apparatus capable of exposing and patterning small areas with 300 nm pitch patterns in photoresist. In this example, the sample substrate and the mirror were placed in a fixed position relative to each other by attaching the samples to a machinist's block using two-sided adhesive tape. The diffraction gratings produced by the system described in this example included slight non-uniformities due to non-idealities in the spectrum of the diode. However, despite these non-uniformities, the system was capable of printing millimeter-scale diffraction gratings with sub-wavelength periodicity. Notably, the capital cost of the tool was less than 1000 USD.

Figure 2:
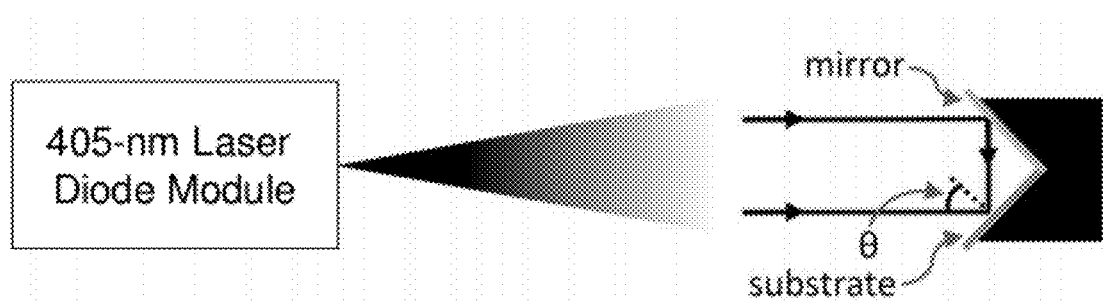
FIG. 2 includes an exemplary top-view, cross-sectional schematic illustration of a system for generating an interference pattern, according to one set of embodiments.

FIG. 2 includes a schematic illustration of a Lloyd's mirror interferometer used for lithographic exposure, comprising an optical source and a machinist's block. The source included a 5 mW, 405 nm wavelength diode laser module, which was about 5 times less expensive than a single-mode diode. The source was aligned using a collimating lens (Thorlabs Part No. C230TME-A) and a prism polarizer (Edmund Optics Part No. NT32-527) cut at the Brewster angle to set the incident polarization at the mirror and sample to s polarization, or equivalently, the electric field was set perpendicular to the mirror's plane of incidence (and hence parallel to the grating lines). The polarizer and lens were removed prior to sample exposures so that the elliptically shaped, diverging light emitted from the diode had the short axis of the ellipse aligned parallel to the grating lines. A mirror was constructed by coating a silicon wafer with 25 nm of chrome on one of its faces using electron-beam evaporation. The mirror was affixed to the machinist's block with two-sided adhesive carbon tape. The mirror's reflectivity was measured to be 76.5% for 45° incident, s-polarized light. The block included a second face oriented perpendicular to the face on which the mirror was mounted. A sample (e.g., a pattern substrate) was attached to the second face using two-sided adhesive carbon tape, so that the edge of the sample was nested behind the mirror edge. The distance between the block and the source was about 25 cm.

Because the laser spectrum can influence the fringe visibility in the interferometer, a spectrometer was used to record the optical output spectrum of the laser prior to exposing samples. The spectrum was measured using a Spectrex spectrometer with 5.5 pm spectral resolution. Since the spectrum was found to drift with use, the lasers were not used for other purposes between the spectrum measurement and the exposure (although the time lag between measurement and exposure varied between samples from a few hours to a few weeks). While there are a variety of ways to stabilize the spectrum emitted by the diode (including optical, mechanical, thermal, and electrical feedback), it was not necessary to introduce these methods to achieve good results during this initial demonstration.

Sample testing included applying a trilayer resist stack to a substrate, optically exposing the samples, and developing the exposed samples. 75 and 100 mm wafers were coated with a resist stack including three separate layers. The first layer was an antireflection coating (ARC) (AZ Electronic Materials, Barli) applied by spin coating at about 7.28 krpm to achieve a 200 nm thickness, followed by baking on a hot plate at 175° C. for 90 s. The second layer included 25 nm of SiO$_x$ sublimated in an electron-beam evaporation system with deposition thickness controlled using in situ quartz crystal monitoring. The third layer included a positive-tone photoresist (PFI-88, Sumitomo Chemicals), spin coated at about 3.8 krpm to achieve an estimated thickness of about 180 nm, followed by baking on a hot plate at 110° C. for 90 s. The SiO$_x$ interlayer was incorporated into the resist stack for postlithographic processing, where it was used to mask the ARC during subsequent etch transfer steps. After deposition of the $SiO_x$ (but before application of the photoresist), wafers were spin coated with a layer of hexamethyldisilazane (HMDS) using the following procedure: (1) application of about 30 drops of HMDS from a plastic pipette to coat the sample surface, (2) a delay of 60 s, (3) 5 s spinning at about 3.8 krpm, and (4) delay in ambient environment of about 5 min before further processing to permit the surface to fully dry. After application of photoresist, the wafers were cleaved into quarters, forming pieces with areas of about 8 to 12 $cm^2$, each piece used for an individual exposure experiment. The optical dose was controlled by using a simple shutter to unblank the optical beam for a timed period. Typical exposure times were about 25 to 30 seconds, and the optical power was about 5 mW. Samples were developed by immersing them in liquid 0.26N (2.4% wt) tetramethylammonium hydroxide developer (CD-26, Rohm & Haas Electronic Materials) for 60 s. The samples were then rinsed by immersing them in de-ionized water, and finally blown dry using dry $N_2$ gas.

After processing, samples were inspected visually, and then briefly in an optical microscope to verify the presence or absence of a grating, after which they were inspected closely using scanning-electron microscopy (SEM). The scanning electron microscope was calibrated using an image of a standard grating. Prior to SEM inspection, samples were coated by sputter deposition of less than 5 nm of Au/Pd. The SEM imaging was performed using a DSM 982 Gemini SEM column from Zeiss SMT, with an in-lens secondary-electron detector, at 5 keV with a 7 mm working distance.

In addition to imaging, samples were evaluated by using a custom-built apparatus to determine the variation in diffraction efficiency across the sample. For this testing, a fabricated sample was placed on a linear translation stage and illuminated with a 405 nm optical beam with a diameter of 82 micrometers at the substrate. The sample was aligned so that the grating lines were perpendicular to the direction of stage motion and to the laser's plane of incidence. A power meter was then placed in the path of the first-order diffraction spot. The reading on the power meter was recorded as a function of stage position in order to determine position dependence of the diffraction efficiency across the sample.

A total of 45 samples were exposed and developed. For three of these samples (A, B, and C) the spectrum of the laser had been measured immediately prior to exposure. These samples were characterized by optical inspection and microscopy, electron microscopy, and diffraction-efficiency mapping as discussed above.

FIGS. 3A-3C show the SEM images of patterned regions of each of samples A, B, and C, respectively, including the corresponding measurements of the grating periods. The SEM images confirmed the qualitative evaluation of the gratings: gratings A and C exhibited superior diffraction quality upon visual inspection under normal ambient room illumination, while grating B required inspection in bright light (ideally full sunlight). The precise measurement of the grating periods were 298, 308, and 315 nm for gratings A, B, and C, respectively. Not wishing to be bound by any particular theory, the variance of a few percent in the grating period may have been due to a variation in alignment of the laser and machinist's block from experiment to experiment.

The angle of incidence for each sample (A, B, and C) was determined by using the SEM measured grating periods. The period $p_i$ can be related to the half-angle of the interfering beams $\theta_i$ (which can vary slightly depending on the configuration of the machinist's block or alignment of the laser) by the formula:

$$p_i = \frac{\lambda_i}{2\sin\theta_i} \quad [1]$$

where i is the corresponding sample index (A, B, or C) and $\lambda_i$ is the wavelength at the peak of the optical spectrum. The measured period for each sample and average wavelength for that exposure was used in conjunction with Equation 1 to establish the half-angle between the two interfering beams. For $p_a$=298 nm, $p_b$=308 nm, and $p_c$=315 nm, and $\lambda_a=\lambda_b$=408.8 nm and $\lambda_c$=408.7 nm (the peaks of the measured laser spectra in each case), the angles correspond to $\theta_a$=43.3°, $\theta_b$=41.6°, and $\theta_c$=40.4°. The observed variance of a few degrees is consistent with the care taken in alignment of each sample (which was performed by eye).

As discussed earlier, diffraction efficiency (and pattern quality) varied greatly across samples on the length scale of millimeters. Not wishing to be bound by any particular theory, this variance may have been associated with the imperfect temporal coherence of the laser source. To support this hypothesis, the measured spatial distribution of diffraction efficiency was compared to the calculated fringe contrast based on the measured source spectrum. The fringe contrast can be calculated (by using the measured source spectrum and the relationship given by Equation 1) as a function of grating position by using the relationship $$V(\Delta L) \propto \int_0^\infty I(\nu) e^{-i2\pi c \Delta L/c} d\nu \quad [2]$$

where $\Delta L$ is the optical path difference between the two arms of the interferometer. The optical path difference can be related to the distance x from the intersection of the mirror with the sample surface by using the equation $$x = \Delta L \frac{\sin\theta}{(1+\cos(\pi-2\theta))} \quad [3]$$

Figure 4A:
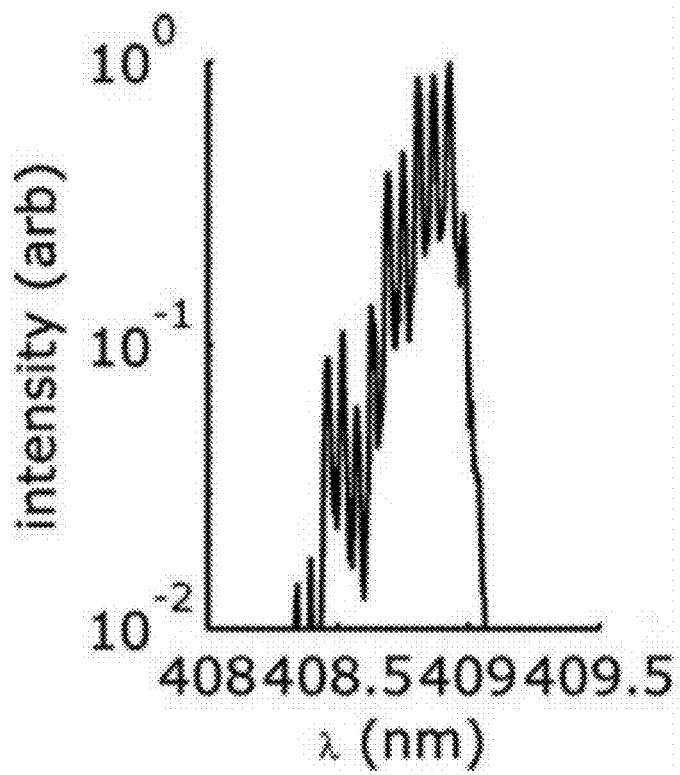
FIGS. 4A-4C include exemplary plots of (A) intensity as a function of wavelength, (B) fringe visibility as a function of position on the substrate, and (C) the measured first order diffracted power from the grating as a function of position, according to one set of embodiments.
Figure 4B:
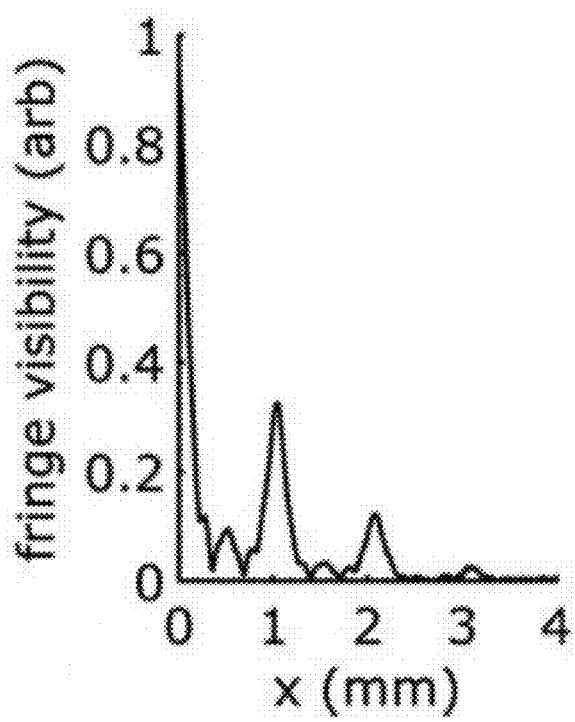
Figure 4C:
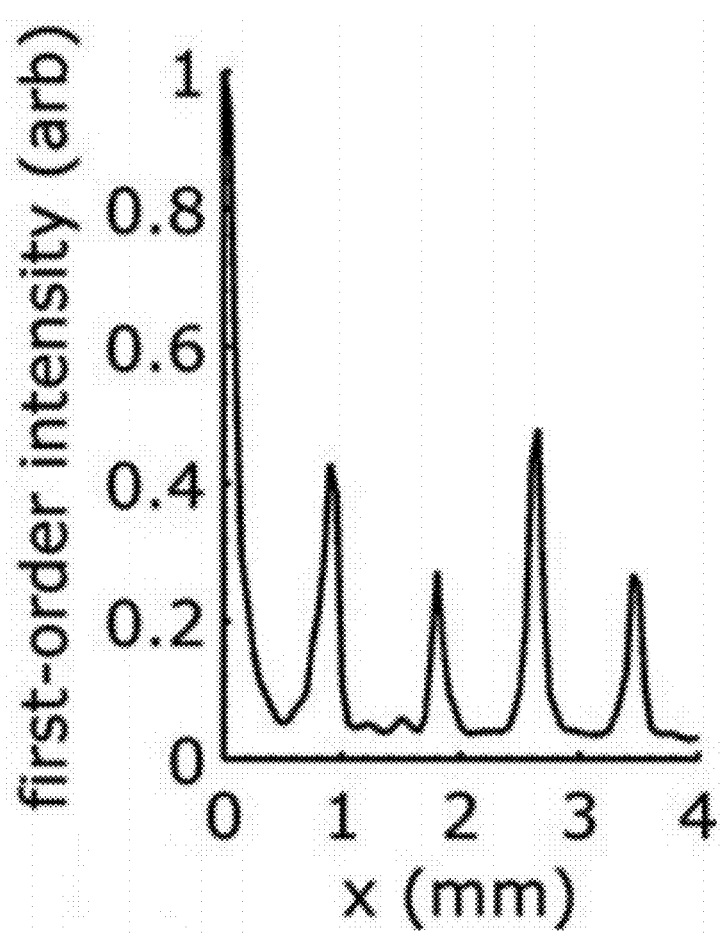

FIGS. 4A-4C show the impact of the laser spectrum on the diffraction efficiency of the final grating: the spectrum was measured, used to calculate the fringe visibility distribution, and then compared to the measured diffraction efficiency. FIG. 4A shows the measured laser spectrum prior to exposing the sample shown in FIG. 3A. FIG. 4B shows a calculation of the expected fringe visibility versus position on the substrate, calculated using the laser optical spectrum shown in FIG. 4A. Finally, FIG. 4C shows the measured diffraction efficiency. A recurrence of regions with strong diffraction visibility was observed, and predicted from the calculated result in FIG. 4B. Not wishing to be bound by any particular theory, this recurrence may have been due to the beating of distinct power peaks in the optical spectrum.

EXAMPLE 2

This example describes the assembly and use of a relatively simple, compact, and low-cost system that can be used, for example, to produce ordered patterns of electromagnetic radiation. The system described in this example includes optical feedback to improve the temporal coherence of the source of electromagnetic radiation.

In addition, a simplified spatial filter was used in this example. The equipment described in this example was used to produce relatively large-area (~cm$^2$) 1- and 2-dimensional patterns with a relatively small-footprint (~0.2 m$^2$) and a capital cost of less than about 6000 USD.

Figure 5:
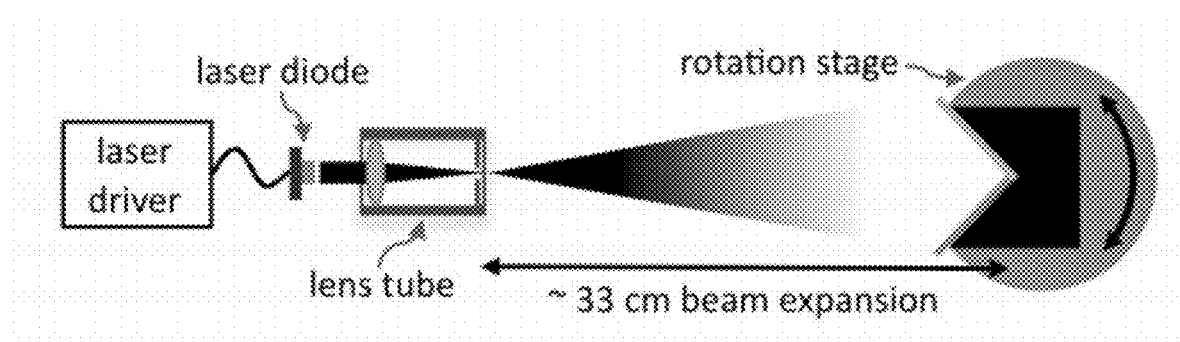
FIG. 5 includes, according to one set of embodiments, an exemplary top-view, cross-sectional schematic illustration of a system for generating an interference pattern.

FIG. 5 includes a schematic illustration of the interference lithography (IL) system used in this example Improvements over the system of Example 1 include the use of a commercially available 12 mW, 405 nm laser diode package with an integrated collimation and volume holographic grating (VHG) optical feedback system (Ondax Part No. CP-405-PLR-12). In addition, a shutter/spatial filter assembly was used that does not require micrometers for alignment. Finally, a rotation stage having arc-minute accuracy was employed. Note that, in this figure, the reflected beam traveling from the mirror to the substrate is shown perpendicular to the optical axis for clarity, and is not perpendicular for the general case. Also, the incident beam is depicted as a plane wave for clarity, an approximation that becomes more accurate as the beam expansion length increases.

The diode package used in the system of FIG. 5 was obtained at a substantially lower cost than more commonly used gas lasers, and it does not require periodic maintenance or frequent alignment. In comparison to grating- or etalon-based external cavity diode laser systems, the embedded VHG makes this IL system easier to configure because it provides a optical feedback system without requiring any external cavity alignment. The diode was mounted in a rotation mount to allow the polarization of the beam to be set with the E-field pointing perpendicular to the plane-of-incidence of the substrate and to allow the laser source to be attached to the beam shutter and spatial filter. Additionally the laser current was controlled with driver circuitry, and no effort was made to control the laser's power or temperature.

A low-cost and low-maintenance spatial filter was built using a lens (Thorlabs Part No. LB1471-A; bi-Convex Lens, 25.4 mm Dia, f=50.0 mm, ARC: 350-700 mm) aligned through a lens tube to a pinhole (Newport Part No. 910PH-5; 5 micrometer diameter pinhole) that was mounted on a +/−1 mm travel, 100 threads-per-inch (TPI) XY lens translating mount (Thorlabs Part No. LM1XY). The 0.25 NA lens was mounted within the lens tube (Thorlabs Part No. SM1L10), and the translating mount was attached collinearly to the lens tube. The lens' position was adjusted with 40 TPI retaining rings to bring the pinhole close to the focal plane, and the 100 TPI screws on the translating mount provided enough control to align the 5-µm-diameter pinhole to the focal spot of the lens. This design made use of the passive linearity and stability of a lens tube to eliminate the tip-tilt stage of more elaborate spatial filters. Beyond the spatial filter, the beam freely expands until it reaches the substrate stage. The distance between the spatial filter and the substrate stage was only 33 cm.

The substrate/mirror mount included a 90° angle machinist's v-block connected to a rotation stage with micrometer controlled travel. Rotation of the v-block allowed control of the pitch of the periodic patterns. On one side of the v-block was mounted a 3.5 cm×5.0 cm aluminum first-surface mirror with a multi-layer film of dielectrics on top. On the other side was placed the substrate. Both were adhered to the machinist's block with double-sided adhesive carbon tape. Together, the proposed tool minimized size, complexity, and cost.

The system in this example had a footprint of only 0.2 m$^2$. Setup, maintenance, and alignment were relatively simple, and the system cost less than 6000 USD.

In the experiments described in Example 1, it was observed that there was a strong correlation between the fringe visibility calculated from the power spectrum and the measured first-order diffraction efficiency from fabricated gratings. It was believed that the multi-mode power spectrum was causing a low spatial frequency (about 1 mm$^2$ scale) modulation of the λ/2-period standing wave intensity pattern that was then recorded in photoresist. Therefore, it was believed that the beating could be eliminated by exposing test substrates with a narrow-spectrum laser and measuring the first-order diffraction efficiency along the direction on the substrate that starts at zero path-length-difference and runs perpendicular to the mirror.

To test the performance of the improved design, test substrates were fabricated and exposed using the system. The test substrates were then developed and the resulting gratings were imaged in a top-down view. The diffraction efficiencies of the samples were measured. Finally, the grating patterns were transferred and imaged again in cross-section.

Test substrates included a trilayer resist stack. The three layers included: (1) a bottom layer of 200 or 303.1 nm of Barli (AZ Electronic Materials) antireflection coating (ARC); (2) 25 nm of evaporated silicon oxide (SiO$_x$); and (3) 180 nm of PFI-88 (Sumitomo Chemicals), a positive tone photoresist. In between the SiO$_x$ and photoresist, a layer of hexamethyldisilazane (HMDS) was spin coated to promote adhesion of the photoresist to the SiO$_x$.

Lithographic exposures were carried out at a 42.5 mA laser-diode drive current. Before exposure, we measured the incident power over a 0.71 cm$^2$ area at the center of the v-block and found the power to be about 100 µW. Using the incident intensity (incident power/detector area) and the clipping dose (the dose at which the resist goes from unexposed to exposed), the exposure time was derived. Exposure times for different angles were calculated using the formula:

$$t = \frac{D_0}{I_p T(1+R)\cos\theta} \quad [4]$$

where t is the exposure time, D$_0$ is the clipping dose, I$_p$ is the incident laser intensity, T is the proportion of light transmitted through the resist, R is the fraction of light reflected into the resist from the antireflection coating layer, and θ is the beam angle at the substrate (as depicted in FIG. 2). From test exposures, the clipping dose was observed to be about 52 mJ/cm$^2$.

Two-dimensional patterns required a double-exposure technique: a first exposure was done to provide half the clipping dose after which the substrate is rotated 90° and the remaining half of the dose was applied. After exposure, substrates were developed in liquid tetramethylammonium hydroxide (TMAH, 2.4% wt CD-26, Rohm & Haas Electronic Materials), rinsed in de-ionized water, and then blown dry with N$_2$ gas.

Before inspection in a scanning electron microscope (SEM), less than 5 nm of Au/Pd was sputter-deposited onto the substrates. The SEM was a DSM 982 Gemini from Zeiss SMT with an in-lens secondary-electron detector. All images were taken at 5 keV electron energy at a 4 mm working distance.

The spectrum of the laser was measured with a Spectrex spectrometer with 5.5 pm spectral resolution at the same laser-diode drive current as was used during exposures.

Automated scans of the first-order diffracted power from fabricated gratings were carried out using a LabView program to control the laser driver, a translation stage, and a power meter simultaneously. A laser beam (405 nm wavelength) passed through a 200-µm-width slit. The beam was then diffracted by a fabricated grating and detected by the power meter to measure the diffracted power. The translation stage scanned the grating at a step size of 0.1 mm.

With portions of the samples that were not already imaged, a standard process was used to transfer patterns from the photoresist to the ARC. Two etch runs were required for the pattern transfer. In the first etch step, reactive ion etching (RIE) was performed with $CHF_3$ gas at 200 V for 120 s with the power ranging between 67-82 Watts during the etch. Then, in the second etch, 16 sccm of Helium and 8 sccm of Oxygen gas was used at 250 V for 315 s at a power of 115-121 Watts. The pressure for both etch runs was 10 mTorr.

In the experiments described in Example 1, it was deduced that the patterning area was limited by the laser spectrum. With the laser described in this example, the following results were accomplished: (1) the new patterns were not limited to 1 $mm^2$ area, (2) the system of this example can be used to control the pitch of the resulting pattern, and (3) the system has the ability for form two-dimensional patterns.

The spectrum of the blue laser diode with optical feedback was measured. The spectrum data had a full width at half maximum ($\Delta\lambda$) of 59.6 pm. The calculated coherence length of the laser ($\sim\lambda^2/\Delta\lambda$) was estimated to be about 2.7 mm Measurement of the laser diode spectrum from the vendor showed a spectrum with $\Delta\lambda=2.9$ pm. The coherence length from this measurement was estimated to be about 5.7 cm. The measurement taken from the vendor was more consistent with the observed results, namely the ability to fabricate diffractive nanostructures that extend continuously over a 1 $cm^2$ area.

Figure 6:
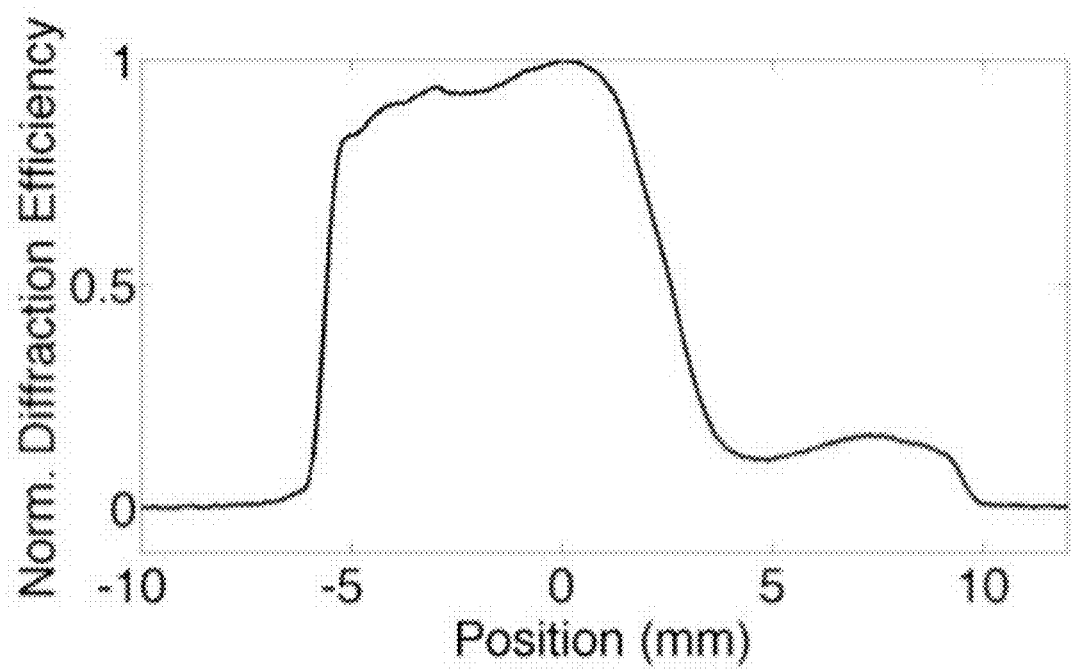
FIG. 6 includes an exemplary plot of the measured first order diffraction efficiency as a function of position, according to one set of embodiments.

FIG. 6 presents the measured first order diffraction efficiency from a grating fabricated with the laser system described in this example. The diffraction efficiency lacks the mm-scale beating pattern seen in the previous example, and has a sharp drop off. Not wishing to be bound by any particular theory, the drop off was believed to be due to the incident intensity variation produced by the spatial filter. Notably the normalized diffraction efficiency was continuously greater than 0.5 over 8 mm. This sample was observed to diffract light from an area larger than 1 $cm^2$.

FIGS. 7A-7D include scanning electron micrograph images of periodic pattern nanostructures in positive photoresist, produced by the system described in this example. These images display the system's ability to change the pitch of one-dimensional gratings and to produce two-dimensional patterns.

Figure 7A:
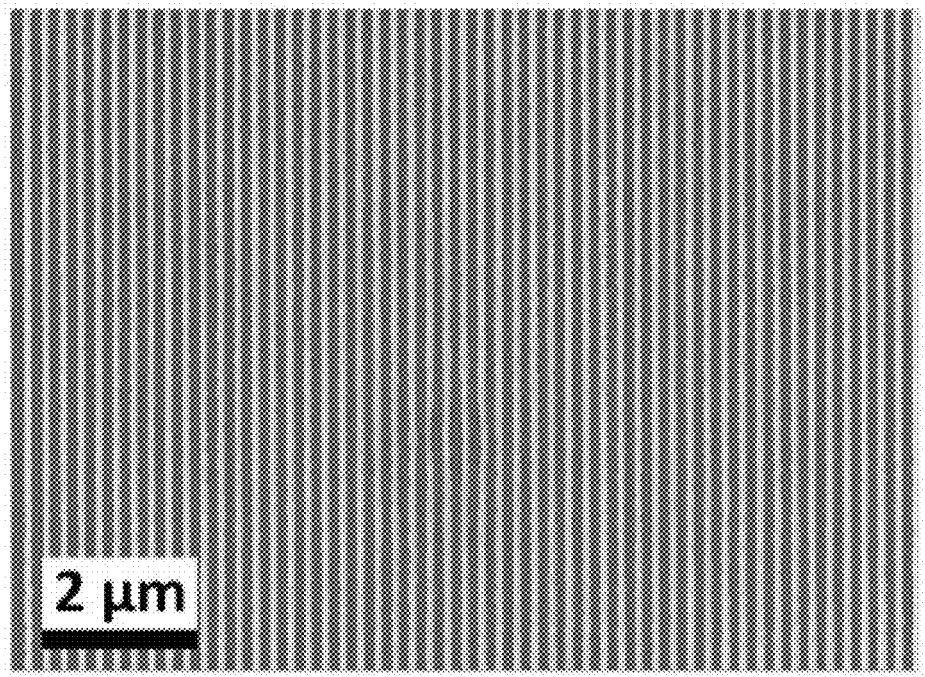
FIGS. 7A-7D include scanning electron microscope images of periodic pattern nanostructure in photoresist, according to one set of embodiments.
Figure 7B:
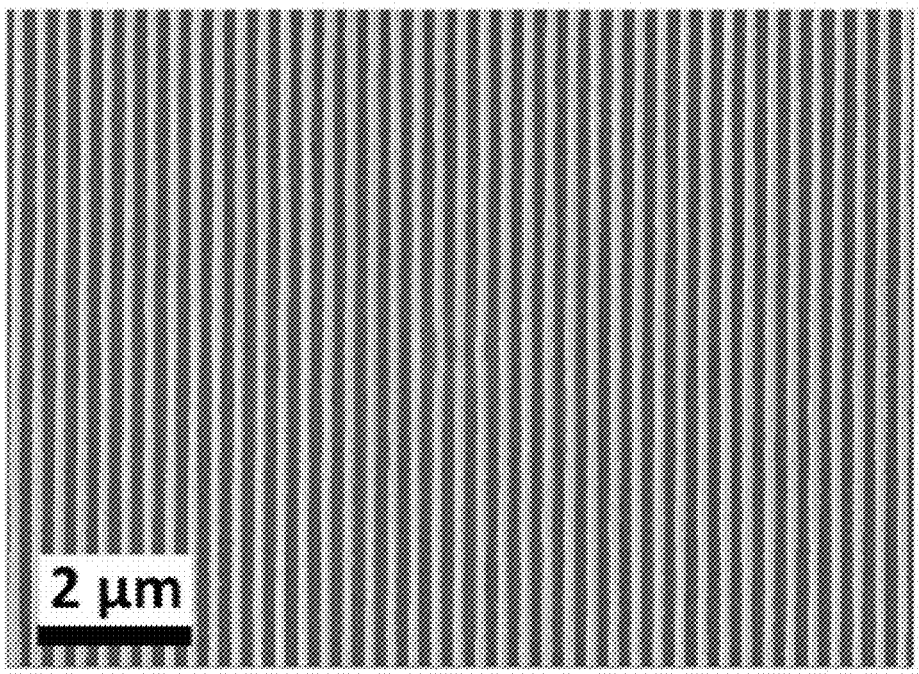
Figure 7C:
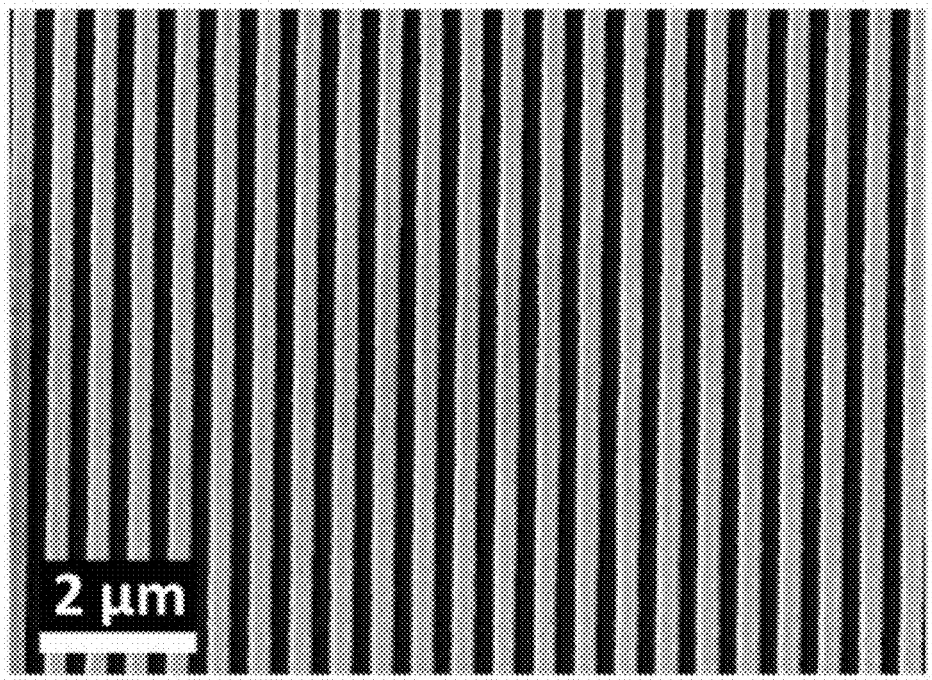
Figure 7D:
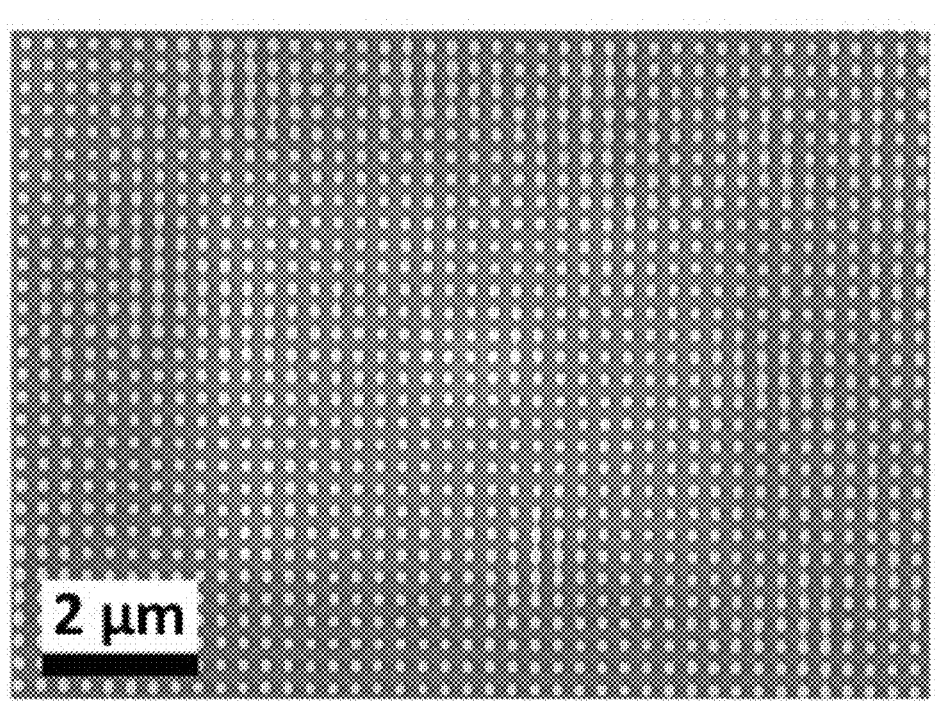

FIGS. 7A-7C include SEM images of three gratings at different pitch. The images were taken at 5 keV electron energy and a working distance of 4 mm. The pitches, which were measured in an SEM, were $p_a=230.0\pm0.2$ nm, $p_b=291.9\pm0.5$ nm, and $p_c=559\pm2.5$ nm. Using Equation 1 and the peak wavelength of the measured laser spectrum (404.9 nm), the exposure angles were determined to be $\theta_a=61.7°$, $\theta_b=43.9°$, and $\theta_c=21.2°$. The duty cycles (the ratios of feature widths to pitches) were also measured in the SEM. They were $w_a=40.5\%$, $w_b=55.8\%$, and $w_c=54.2\%$.

FIG. 7D shows a two-dimensional rod pattern produced with the system described in this example. The pitch of the pattern was 314.3±0.6 nm. There was observable bridging between some of the posts. Not wishing to be bound by any particular theory, it is believed that this bridging was due to a spatial intensity variation that may have been due to incoherent reflection from the mirror edges and/or from imperfections in the spatial filter.

Figure 8A:
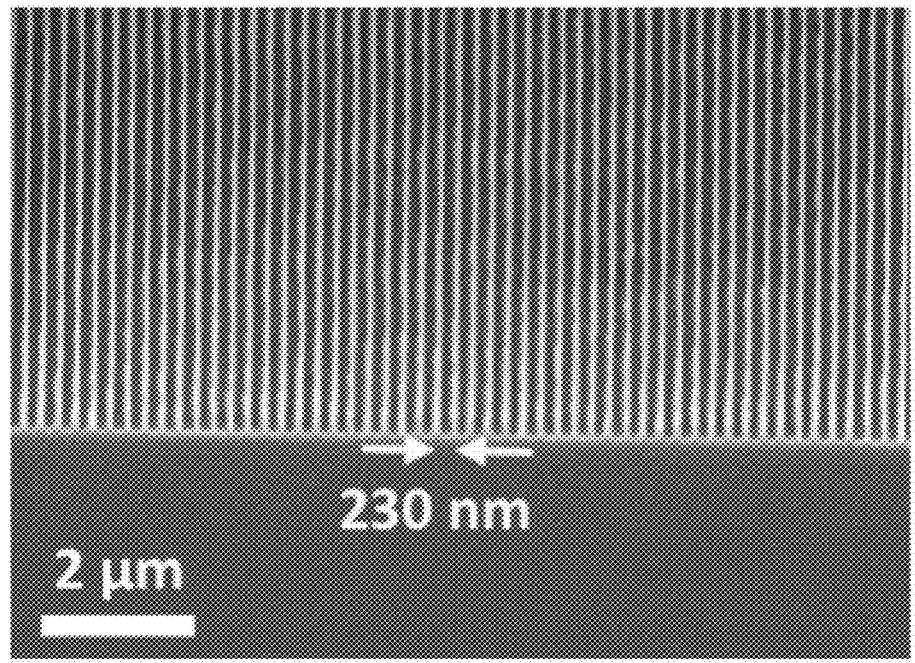
FIGS. 8A-8B include, according to one set of embodiments, one-dimensional periodic patterns transferred into an antireflection coating layer.
Figure 8B:
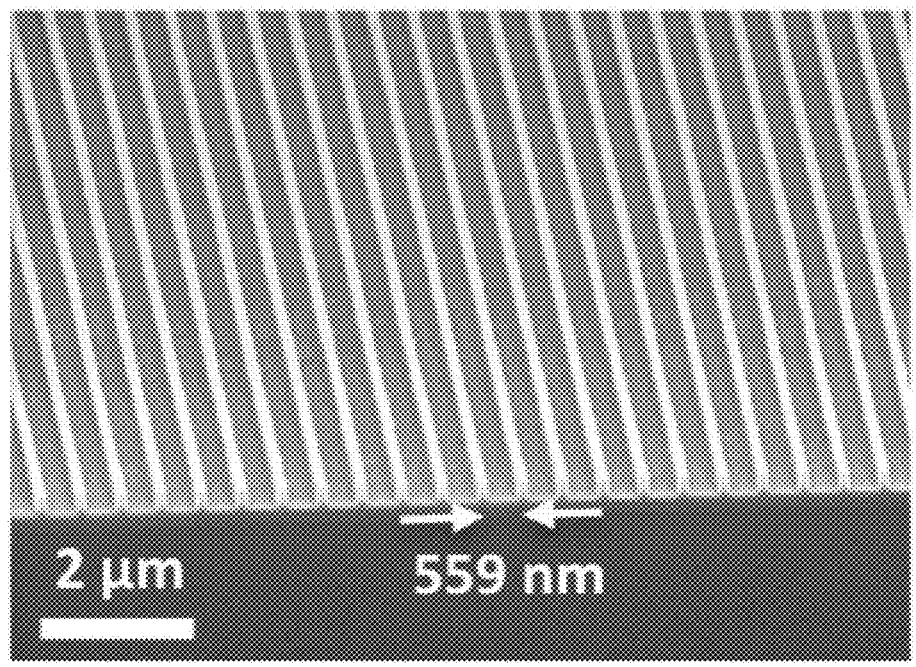

FIGS. 8A-8B show one-dimensionally periodic patterns (grating lines) pattern-transferred into the antireflection coating (ARC) layer. FIG. 8A is of 230 nm pitch and corresponds to the substrate of FIG. 7A. FIG. 8B has a pitch of 559 nm and corresponds to the substrate of FIG. 7C. The scanning-electron-microscope images were taken at 5 keV electron energy and 4 mm working distance.

The system described in this example was used to produce continuous, diffractive nanostructures over 1 $cm^2$, and it is believed that larger patterns can be achieved.

Hyperbolic phase distortion refers to the effect on pitch that is a result of the exposure beam being a spherical wave instead of an ideal plane wave. This causes the pitch to increase as features are farther from the mirror/substrate axis. It has been shown that one can calculate the pitch as a function of position. The mirror setup described in this example caused the pitch to vary by only about 0.05% over a 1 $cm^2$ area.

The pattern uniformity into the resist is affected by standing waves. Standing waves are an intensity modulation traveling into the photoresist. They are caused by interference between the incident beam and reflections from the bottom surface of the photoresist. It has been shown that proper choice of an antireflection coating can minimize the effects of standing waves. Using a software simulation developed by M. Walsh (M.S. Thesis, MIT 2000), it was determined that the reflection from the bottom of the photoresist used in this example was 0.69% for 200 nm of ARC and 2.82% for 303.1 nm of ARC.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system for generating an interference pattern of electromagnetic radiation, comprising:
   a source of electromagnetic radiation;
   a spatial filter;
   a reflective surface; and
   a pattern substrate; wherein:
   the spatial filter is constructed and arranged to receive at least a portion of the electromagnetic radiation from the source, to transmit at least a first portion of the received electromagnetic radiation to the reflective surface, and to transmit a second portion of the received electromagnetic radiation to the pattern substrate,
   the reflective surface and the pattern substrate are mounted on and/or incorporated within a unitary mount such that the reflective surface is part of or mounted to a first surface of the unitary mount and the pattern substrate is part of or mounted to a second surface of the unitary mount and oriented at an angle relative to the first surface of the unitary mount, and
   the reflective surface and the pattern substrate are not substantially spatially adjustable relative to each other.

2. A system as in claim 1, wherein the source of electromagnetic radiation comprises a laser.

3. A system as in claim 2, wherein the laser comprises a laser diode.

4. A system as in claim 2, wherein the source of electromagnetic radiation comprises a diffraction grating constructed and arranged to provide optical feedback to the laser.

5. A system as in claim 4, wherein the laser and the diffraction grating are not substantially spatially adjustable relative to each other.

6. A system as in claim 1, wherein the spatial filter comprises a focusing element.

7. A system as in claim 6, wherein the focusing element comprises a lens.

8. A system as in claim 1, wherein the spatial filter comprises a transmission element.

9. A system as in claim 6, wherein the focusing element is constructed and arranged to receive the portion of the electromagnetic radiation directly from the source.

10. A system as in claim 9, wherein the focusing element of the spatial filter is constructed and arranged to transmit the portion of the received electromagnetic radiation directly to a transmission element.

11. A system as in claim 8, wherein the transmission element comprises an aperture formed in a material that reflects and/or absorbs at least one wavelength of the electromagnetic radiation from the source.

12. A system as in claim 1, wherein the spatial filter comprises a focusing element and a transmission element that are not substantially spatially adjustable relative to each other along a focal axis of the focusing element.

13. A system as in claim 1, wherein the reflective surface comprises a mirror.

14. A system as in claim 1, wherein the mount is a rotatably moveable mount.

15. A system as in claim 14, wherein the rotatably moveable mount is constructed and arranged such that, upon rotation, the angle of incidence of the electromagnetic radiation from the spatial filter upon the reflective surface and/or pattern substrate is altered.

16. A system as in claim 1, wherein the system is constructed and arranged for interference lithography.

17. A system as in claim 1, wherein the pattern substrate comprises photoresist.

18. A system as in claim 1, wherein the system is capable of producing a regular pattern that defines an area of at least about 0.1 mm$^2$.

19. A system as in claim 1, wherein the system has a footprint of less than about 1 m$^2$.

20. A system as in claim 1, wherein:
   the spatial filter comprises a focusing element and a transmission element;
   the focusing element of the spatial filter is constructed and arranged to receive at least a portion of the electromagnetic radiation from the source and to transmit at least a portion of the received electromagnetic radiation to the transmission element; and
   the transmission element of the spatial filter is constructed and arranged to transmit at least the first portion of the received electromagnetic radiation from the focusing element to the reflective surface, and to transmit the second portion of the received electromagnetic radiation from the focusing element to the pattern substrate.

* * * * *